United States Patent
Tsai et al.

[11] Patent Number: 6,025,263
[45] Date of Patent: Feb. 15, 2000

[54] UNDERLAYER PROCESS FOR HIGH $O_3$/TEOS INTERLAYER DIELECTRIC DEPOSITION

[75] Inventors: Hsin-Chuan Tsai; Chung-Min Lin, both of Taipei, Taiwan

[73] Assignee: Nanya Technology Corporation, Luchu Taoyuan, Taiwan

[21] Appl. No.: 08/927,287

[22] Filed: Sep. 11, 1997

[30] Foreign Application Priority Data

Jul. 15, 1997 [TW] Taiwan ................................. 86109964

[51] Int. Cl.[7] .............................................. H01L 21/4763
[52] U.S. Cl. ........................ 438/624; 438/622; 438/626; 438/631; 438/761; 438/778; 438/787; 438/791; 438/958
[58] Field of Search ..................... 438/622, 624, 438/626, 631, 761, 778, 787, 791, 958

[56] References Cited

U.S. PATENT DOCUMENTS

| | | | |
|---|---|---|---|
| 4,446,194 | 5/1984 | Candelaria et al. | 428/428 |
| 4,908,333 | 3/1990 | Shimokawa et al. | 437/195 |
| 5,252,515 | 10/1993 | Tsai et al. | 437/195 |
| 5,744,378 | 4/1998 | Homma | 437/195 |
| 5,766,974 | 6/1998 | Sardella et al. | 437/195 |

*Primary Examiner*—John F. Niebling
*Assistant Examiner*—David A. Zarneke
*Attorney, Agent, or Firm*—Bacon & Thomas

[57] ABSTRACT

A underlayer process for high $O_3$/TEOS interlayer dielectric deposition is disclosed. First, a layer of metal pattern is defined on a semiconductor substrate, then a layer of dielectric underlayer is deposited, next, a high $O_3$/TEOS interlayer dielectric is formed to achieve planarization. The key point of this process is to apply materials with higher refraction index than conventional PE-TEOS for forming interlayer dielectric underlayer. The mentioned material can be PE-$SiH_4$ with a constant or decreasing refraction index with the distance from the semiconductor substrate. The underlayer can also be bi-layer structure consisting of high refraction index bottom layer and low refraction index surface layer. This invention can effectively suppress the problem caused from high surface sensitivity of $O_3$/TEOS, and improve the quality of interlayer dielectric planarization process dramatically.

13 Claims, 3 Drawing Sheets

UNDERLAYER PROCESS FOR HIGH O₃/TEOS INTERLAYER DIELECTRIC DEPOSITION

BACKGROUND OF THE INVENTION (1) Field of the Invention

The present invention relates generally to the field of integrated-circuit (IC) manufacturing process, and more particularly, to an improved fabrication process of interlayer dielectric underlayer.

(2) Description of the Prior Art

In order to form compact and high density devices, multiple layers of conductors and insulators are stacked within the limited area in IC fabrication. It tends to have steep and complicated topography on the wafer surfaces. The mentioned scenario can be more caustic in the process of dynamic random access memory (DRAM) because the alternating multi-layers of polysilicon and dielectric layers are deposited and etched to form the capacitors. These complicated topography on wafer surfaces has severe negative effect on subsequent processes. It will diminish the range of depth of focus during lithography exposure especially and distort the photoresist profiles or even cause residue during etching, and it may produce undesired metal lines shorting. The planarization technologies of so-called "biased sputter oxide deposition" or "oxide reflow" are currently employed to solve the topography problem, however they are both time consuming and costly. U.S. Pat. No. 5,393,708 to Hsia et al. (the entire disclosure of which is herein incorporated by reference) describes another simple and low cost technique which is used spin-on-glass (SOG) for planarization as the dielectric interlayer material between two metal layers. The conventional SOG process steps are as following:

By employing tetraethoxysilanes (TEOS) as reacting gas, a layer of $SiO_2$ with the refraction index between 1.44 and 1.46 is deposited by the plasma enhanced chemical vapor deposition (PECVD) method, then deposited another dielectric $SiO_2$ layer by using high density $O_3$/TEOS as reacting gas, following employ SOG planarization process to achieve the planarization of the mentioned interlayer dielectric. However the high sensitivity of $O_3$/TEOS surface causes a known problem in the art. The thickness of $O_3$/TEOS layer will be affected by the interaction between $O_3$/TEOS surface and that of PE-TEOS during the deposition of $O_3$/TEOS onto the PE-TEOS dielectric underlayer. Moreover it may result in a non-uniform thickness of dielectric layer because of the inhomogeneties in PE-TEOS layer. Besides, the various aspect ratios of metal lines of prior layer tend to prevent the deposition of $SiO_2$ from filling into the gap between metal lines completely and degrade the planarization efficiency of the interlayer dielectric layer. Conventionally, there are several methods of improving the $O_3$/TEOS surface sensitivity problem include following techniques: (1) plasma or chemical treatment on wafer surface; (2) dual frequency PE-TEOS dielectric underlayer deposition; (3) low density $O_3$/TEOS layer is deposited prior to the deposition of high density $O_3$/TEOS interlayer dielectric. With these approaches, the process is more complicated and a simpler method is needed. This invention reveals an improved process of interlayer dielectric planarization, particularly for solving the $O_3$/TEOS surface sensitivity problem in the fabrication process of dielectric underlayer.

SUMMARY OF THE INVENTION

In view of foregoing, it is the principal object of the present invention to provide an improved method of interlayer dielectric planarization, which can effectively solve the problem of $O_3$/TEOS surface sensitivity and ameliorate the result of interlayer dielectric planarization.

Accordingly, it is a another object of the present invention to provide a reliable, low cost and very manufacturable process for planarization in the fabrication of interlayer dielectric.

In accordance with the objects of the invention, a method for interlayer dielectric planarization is described below.

First, a metal line pattern is defined on semiconductor surface, a dielectric underlayer is then deposited on the layer of pre-patterned metal lines, then an interlayer dielectric is formed using $O_3$/TEOS as reactant to achieve planarization.

A PE-TEOS layer with higher refraction index is employed to form the dielectric underlayer that is the key point of this invention to achieve the mentioned purposed. This material with a higher refraction index compared with conventional PE-TEOS can be PE-$SiH_4$ with a constant refraction index or with the refraction index decreasing with the distance from the semiconductor substrate. This material can also be bilayer structure of high refraction index bottom layer and low refraction index surface layer. This invention can effectively suppress the problem caused from the high surface sensitivity of $O_3$/TEOS, and improve the result of interlayer dielectric planarization dramatically.

BRIEF DESCRIPTION OF THE DRAWINGS

In the accompanying drawings forming a material part of this description, there is shown.

DESCRIPTION OF THE PREFERRED EMBODIMENTS

The invention disclosed herein is directed to a method for interlayer dielectric planarization on top of metal pattern by utilizing selective deposition of the dielectric underlayers. Although the embodiments apply to single layer of metal conductor pattern only, those who are familiar with semiconductor IC fabrication processes can easily elaborate this method to achieve interlayer planarization on the process for devices with multi-layer metal interconnecting.

In the next place, preferred embodiments of the present invention will be described with reference to figures.

Figure 1B:
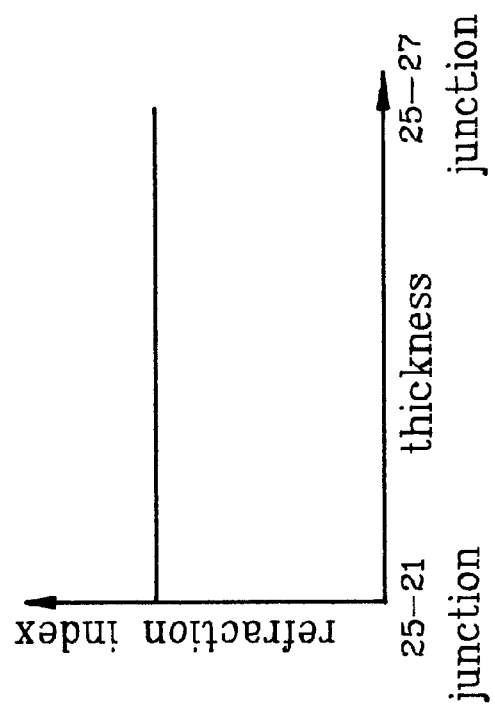
FIG. 1(B) is the relationship between dielectric underlayer thickness and refraction index according to the first embodiment of this invention.
Figure 1A:
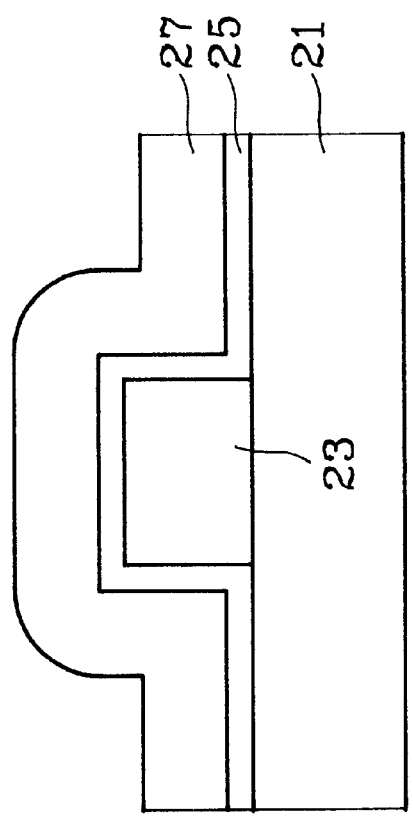
FIG. 1(A) is a cross-sectional representation of a silicon substrate according to the first embodiment of this invention.

First Embodiment of the Invention:

Referring now to FIG. 1(A), a metal line pattern 23 is defined onto the surface of semiconductor substrate 21, then a dielectric underlayer 25 with constant refraction index is built on the metal pattern 23 and semiconductor substrate 21, after that the planarization is achieved by depositing a high $O_3$/TEOS interlayer dielectric layer 27 overlaying the underlayer 25.

The method of forming metal line pattern 23 is within well known technical field and is not described here. The formation of dielectric underlayer 25 is the major and important step of this invention. Making dielectric underlayer 25 with refraction index (RI) in the range of 1.48 to 1.60 can reduce the surface sensitivity of sequential interlayer dielectric 27 with respect to substrate surface in order to obtain interlayer dielectric 27 with improved uniformity. The dielectric underlayer 25 is usually deposited by plasma enhanced chemical vapor deposition (PECVD) by employing $SiH_4$ as reactant to produce $SiO_2$, referred as PE-$SiH_4$ in later text. The process condition is: a temperature range of 350 to 500° C. on wafers, a pressure range of 1 to 10 torr, and a power range of 50 to 900 watts, with $SiH_4$ flow rate of 50 to 300 sccm, and $N_2O$ flow rate of 1000 to 3000 sccm, to obtain layer thickness of between 500 to 5000 Angstroms. The relationship between layer thickness and refraction index is shown in FIG. 1(B). The refraction index of this embodiment is a constant value. The material of the interlayer dielectric 27 is usually fluid $SiO_2$ layer deposited by the process of atmospheric pressure CVD (APCVD) or sub-atmospheric pressure CVD (SACVD) by employing high density $O_3$/TEOS as reactants, and the reactant is TEOS with high concentration $O_3$ with density range of 80 to 150 g/m$^3$. Chamber pressure of the process is in the range of 200 to 760 torr, and the reaction temperature range of 350 to 500° C., to deposit a layer thickness of between from 8000 to 15000 Angstroms.

Figure 2B:
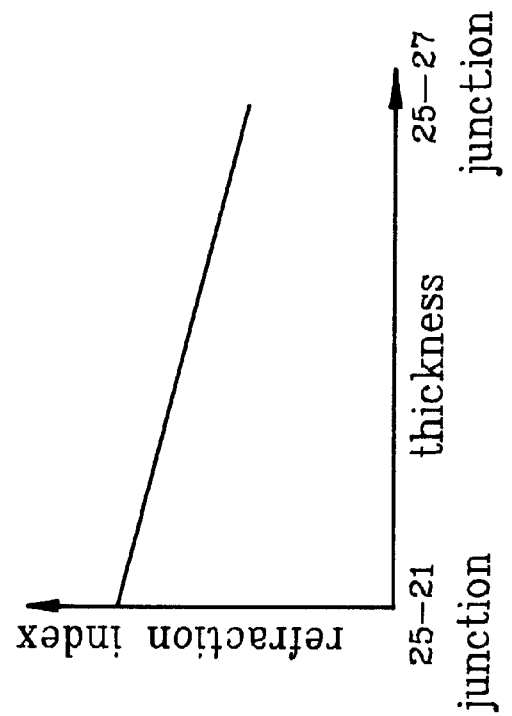
FIG. 2(B) is the relationship between dielectric underlayer thickness and refraction index according to the second embodiment of this invention.
Figure 2A:
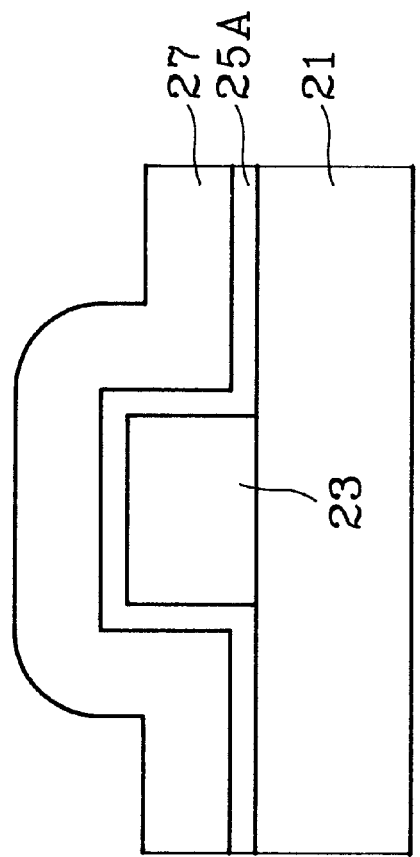
FIG. 2(A) is the cross-section representation of a silicon substrate according to the second embodiment of this invention.

Second Embodiment of the Invention:

Referring to FIG. 2(A), a metal line pattern 23 is defined on the surface of semiconductor substrate 21, then a dielectric underlayer 25A with decreasing refraction index is deposited onto the metal pattern 23 and semiconductor substrate 21, then an interlayer dielectric layer 27 is formed by employing $O_3$/TEOS as reactant to achieve planarization.

The method of forming dielectric underlayer 25A is the major and important step of this invention. Referring to FIG. 2(B), the dielectric underlayer 25A has higher refraction index at the interface of substrate and dielectric underlayer (21–25A). And it is within the range from 1.55 to 1.65. The refraction index is gradually and monotonely decreasing to a value in the range of 1.45 to 1.50 at the interface of dielectric underlayer and interlayer dielectric (25A–27). It can reduce the sensitivity of interlayer dielectric 27 to substrate surface with better effects than that in the first embodiment, and obtain interlayer dielectric 27 with improved uniformity. Said dielectric underlayer 25A is also deposited by said PECVD process with proper chamber pressure, power and gas flow, layer thickness range 500–5000 angstroms.

Figure 3B:
FIG. 3(B) is the relationship between dielectric underlayer thickness and refraction index according to the third embodiment of this invention.
Figure 3A:
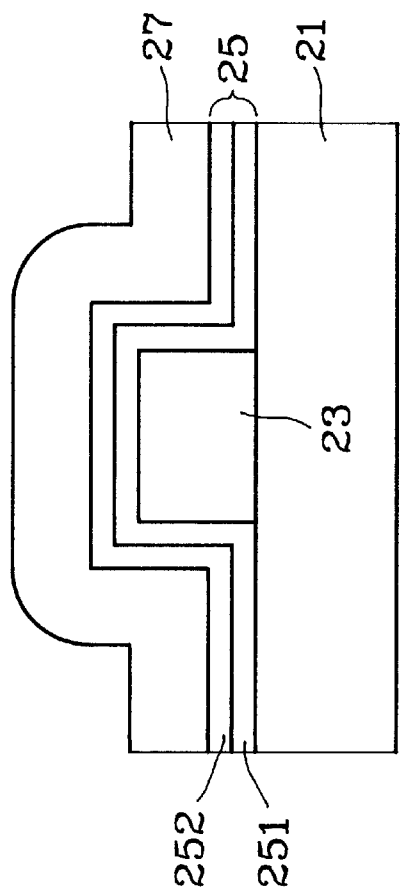
FIG. 3(A) is the cross-section representation of a silicon substrate according to the third embodiment of this invention.

Third Embodiment of the Invention:

Referring to FIG. 3(A), a layer of metal line pattern 23 is defined onto the semiconductor substrate 21, then a dielectric bilayer structure 25 consisting of a high refraction index bottom layer 251 and a lower refraction index surface layer 252 is deposited on the metal pattern 23 and semiconductor substrate 21, then an interlayer dielectric 27 is formed by using $O_3$/TEOS as reactant to achieve planarization. Referring to FIG. 3(B), the higher refraction index bottom layer 251 of the dielectric underlayer 25 is usually PE-$SiH_4$ made by the previously discussed process. As mentioned before, its refraction index is within the ranges from 500 to 5000 angstroms. Alternatively, it can also be oxynitride (SiON) deposited by PECVD with refraction index in the range from 1.75 to 2.25, or nitride (SiN) deposited by PECVD with refraction index in the range of 1.90 to 2.20.

The lower refraction index surface layer 252 of the dielectric underlayer 25 is usually PE-$SiH_4$ made by the process mentioned before, the refraction index (RI) of PE-$SiH_4$ is in the ranges from 1.45 to 1.55 and the thickness is within the ranges from 500 to 5000 angstroms. It can also be TEOS deposited by PECVD with refraction index (RI) in the range of 1.44 to 1.46.

While the invention has been particularly shown and described with reference to the preferred embodiments thereof, it will be understood by those skilled in the art that various changes in form and details may be made without departing from the spirit and scope of the invention.

What is claimed is:

1. A method of interlayer dielectric planarization comprising the steps of:
   (a) defining at least one metal line pattern onto a semiconductor substrate,
   (b) forming a dielectric underlayer of silicon dioxide ($SiO_2$) with constant refraction index onto the entire substrate by plasma enhanced chemical vapor deposition employing $SiH_4$, as a reactant gas (PE-$SiH_4$), wherein said refraction index of said dielectric underlayer is in the range from 1.48 to 1.6; and
   (c) forming an interlayer dielectric onto said dielectric underlayer, wherein said interlayer dielectric is $SiO_2$ formed by employing ozone and TEOS as reactants ($O_3$-TEOS);
   whereby surface sensitivity of said interlayer dielectric to said dielectric underlayer is eliminated.

2. The method according to claim 1, wherein said PE-$SiH_4$ deposited $SiO_2$ layer has a thickness in the range from 500 to 5000 Angstroms.

3. A method of underlayer dielectric planarization comprising the steps of:
   (a) defining at least one metal line pattern onto a semiconductor substrate,
   (b) depositing a dielectric underlayer with varying refraction index onto the entire substrate, wherein said refraction index of said dielectric underlayer is decreasingly outward said substrate; and
   (c) forming an interlayer dielectric onto said dielectric underlayer, wherein said interlayer dielectric is $SiO_2$ formed by employing ozone and TEOS as reactants ($O_3$-TEOS).

4. The method according to claim 3, wherein said dielectric underlayer is PE-$SiH_4$, deposited $SiO_2$ layer A with refraction index decreasing from bottom of 1.55 to 1.65 to top of 1.45 to 1.5.

5. The method according to claim 4, wherein said PE-$SiH_4$ deposited $SiO_2$ layer has a thickness in the range from 500 to 5000 Angstroms.

6. A method of interlayer dielectric planarization comprising the steps of:
   (a) defining at least one metal line pattern onto a semiconductor substrate,
   (b) forming a bilayer structure of a first dielectric bottom layer and a second dielectric surface layer on said metal line pattern by plasma enhanced chemical vapor deposition, wherein bottom layer has a higher refraction index then said surface layer; and
   (c) forming an interlayer dielectric onto the said second dielectric surface layer, wherein said interlayer dielectric is SiO$_2$ formed by employing ozone and TEOS as reactants (O$_3$-TEOS);

whereby surface sensitivity of said interlayer dielectric to said surface layer is eliminated.

7. The method according to claim 6, wherein said first dielectric bottom layer has a thickness in the range from 500 to 5000 Angstroms.

8. The method according to claim 7, wherein said first dielectric bottom layer is PE-SiH$_4$, deposited SiO$_2$ layer with refraction index in the range from 1.5 to 1.65.

9. The method according to claim 7, wherein said first dielectric bottom layer is plasma enhanced chemical vapor deposited oxynitride (PE-SiON), with refraction index in the range from 1.75 to 2.25.

10. The method according to claim 7, wherein said first dielectric bottom layer is plasma enhanced chemical vapor deposited nitride (PE-SiN), with refraction index in the range from 1.9 to 2.20.

11. The method according to claim 6, wherein said second dielectric surface layer has a thickness in the range from 500 to 5000 angstroms.

12. The method according to claim 11, wherein said second dielectric surface layer is PE-SiH$_4$, deposited SiO$_2$ layer with refraction index in the range from 1.45 to 1.55.

13. The method according to claim 11, wherein said second dielectric surface layer is with PE-TEOS, with refraction index in the range from 1.44 to 1.46.

* * * * *